(12) United States Patent
An et al.

(10) Patent No.: US 6,800,885 B1
(45) Date of Patent: Oct. 5, 2004

(54) ASYMMETRICAL DOUBLE GATE OR ALL-AROUND GATE MOSFET DEVICES AND METHODS FOR MAKING SAME

(75) Inventors: Judy Xilin An, San Jose, CA (US); Bin Yu, Cupertino, CA (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 62 days.

(21) Appl. No.: 10/385,652

(22) Filed: Mar. 12, 2003

(51) Int. Cl.⁷ .................. H01L 29/80; H01L 29/788; H01L 21/336

(52) U.S. Cl. .................. 257/275; 257/316; 257/192; 257/347; 257/E29.302; 257/E21.415

(58) Field of Search .................. 257/275, 316, 257/315, 192, 347, 194, 349, E29.302, E21.415, E29.275, E29.298

(56) References Cited

U.S. PATENT DOCUMENTS

| | | | | |
|---|---|---|---|---|
| 4,317,125 A | * | 2/1982 | Hughes et al. | 257/275 |
| 5,739,052 A | * | 4/1998 | Krishnan et al. | 438/17 |
| 6,458,662 B1 | * | 10/2002 | Yu | 438/286 |
| 6,635,909 B2 | * | 10/2003 | Clark et al. | 257/192 |
| 6,657,252 B2 | * | 12/2003 | Fried et al. | 257/316 |
| 2004/0036118 A1 | * | 2/2004 | Abadeer et al. | 257/347 |

FOREIGN PATENT DOCUMENTS

JP         2003204068      *   7/2004

OTHER PUBLICATIONS

Digh Hisamoto et al., "FinFET–A Self–Aligned Double–Gate MOSFET Scalable to 20nm," IEEE Transactions on Electron Devices, vol. 47, No. 12, Dec. 2000, pp. 2320–2325.
Yang–Kyu Choi et al., "Sub–20nm CMOS FinFET Technologies," 2001 IEEE, IEDM, pp. 421–424.
Xuejue Huang et al., "Sub–50 nm P–Channel FinFET," IEEE Transactions on Electron Devices, vol. 48, No. 5, May 2001, pp. 880–886.
Xuejue Huang et al., "Sub 50–nm FinFET: PMOS," 1999 IEEE, IEDM, pp. 67–70.
Yang–Kyu Choi et al., "Nanoscale CMOS Spacer FinFET for the Terabit Era," IEEE IEDM, Electron Device Letters, vol. 23, No. 1, Jan. 2002, pp. 25–27.

* cited by examiner

*Primary Examiner*—John F. Niebling
*Assistant Examiner*—Ron Pompey
(74) *Attorney, Agent, or Firm*—Harrity & Snyder, LLP

(57) ABSTRACT

An asymmetric double gate metal-oxide semiconductor field-effect transistor (MOSFET) includes a first fin formed on a substrate; a second fin formed on the substrate; a first gate formed adjacent first sides of the first and second fins, the first gate being doped with a first type of impurity; and a second gate formed between second sides of the first and second fins, the second gate being doped with a second type of impurity. An asymmetric all-around gate MOSFET includes multiple fins; a first gate structure doped with a first type of impurity and formed adjacent a first side of one of the fins; a second gate structure doped with the first type of impurity and formed adjacent a first side of another one of the fins; a third gate structure doped with a second type of impurity and formed between two of the fins; and a fourth gate structure formed at least partially beneath one or more of the fins.

8 Claims, 28 Drawing Sheets

ASYMMETRICAL DOUBLE GATE OR ALL-AROUND GATE MOSFET DEVICES AND METHODS FOR MAKING SAME

FIELD OF THE INVENTION

The present invention relates generally to semiconductor devices and, more particularly, to asymmetric double gate or all-around gate metal-oxide semiconductor field-effect transistor (MOSFET) devices and methods of making these devices.

BACKGROUND OF THE INVENTION

Scaling of device dimensions has been a primary factor driving improvements in integrated circuit performance and reduction in integrated circuit cost. Due to limitations associated with gate-oxide thicknesses and source/drain (S/D) junction depths, sealing of existing bulk MOSFET devices below the 0.1 µm process generation may be difficult, if not impossible. New device structures and new materials, thus, are likely to be needed to improve FET performance.

Double-gate MOSFETs represent devices that are candidates for succeeding existing planar MOSFETs. In double-gate MOSFETs, the use of two gates to control the channel significantly suppresses short-channel effects. A FinFET is a double-gate structure that includes a channel formed in a vertical fin. Although a double-gate structure, the FinFET is similar to existing planar MOSFETs in layout and fabrication techniques. The FinFET also provides a range of channel lengths, CMOS compatibility, and large packing density compared to other double-gate structures.

SUMMARY OF THE INVENTION

Implementations consistent with the principles of the invention provide asymmetric double gate and all-around gate FinFET devices and methods for manufacturing these devices.

In one aspect consistent with the principles of the invention, a metal-oxide semiconductor field-effect transistor (MOSFET) includes a first fin formed on a substrate; a second fin formed on the substrate; a first gate formed adjacent first sides of the first and second fins, the first gate being doped with a first type of impurity; and a second gate formed between second sides of the first and second fins, the second gate being doped with a second type of impurity.

According to another aspect, a method for forming gates in a MOSFET is provided. The method includes forming a fin structure on a substrate; forming a first doped gate structure adjacent the fin structure; removing a portion of the fin structure; and forming a second doped gate structure by filling at least some of the removed portion of the fin structure with gate material.

According to yet another aspect, a MOSFET includes multiple fins, a first gate structure doped with a first type of impurity and formed adjacent a first side of one of the fins; a second gate structure doped with the first type of impurity and formed adjacent a first side of another one of the fins; a third gate structure doped with a second type of impurity and formed between two of the fins; and a fourth gate structure formed at least partially beneath one or more of the fins.

According to a further aspect, a method for forming gates in a MOSFET is provided. The method includes forming a fin structure on a substrate; forming first and second doped gate structures adjacent the fin structure; removing one or more portions of the fin structure to form multiple fins; forming a third doped gate structure between the fins; and forming a fourth gate structure extending at least partially under at least one of the fins.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide asymmetric double and all-around gate FinFET devices and methods for manufacturing these devices. Asymmetric gates are biased separately (e.g., n+ and p+) and may have better performance than symmetric gates. Further, logic circuits may be formed using a fewer number of transistors when the transistors are formed with asymmetric gates, as described below.

Double Gate MOSFET

Figure 1:
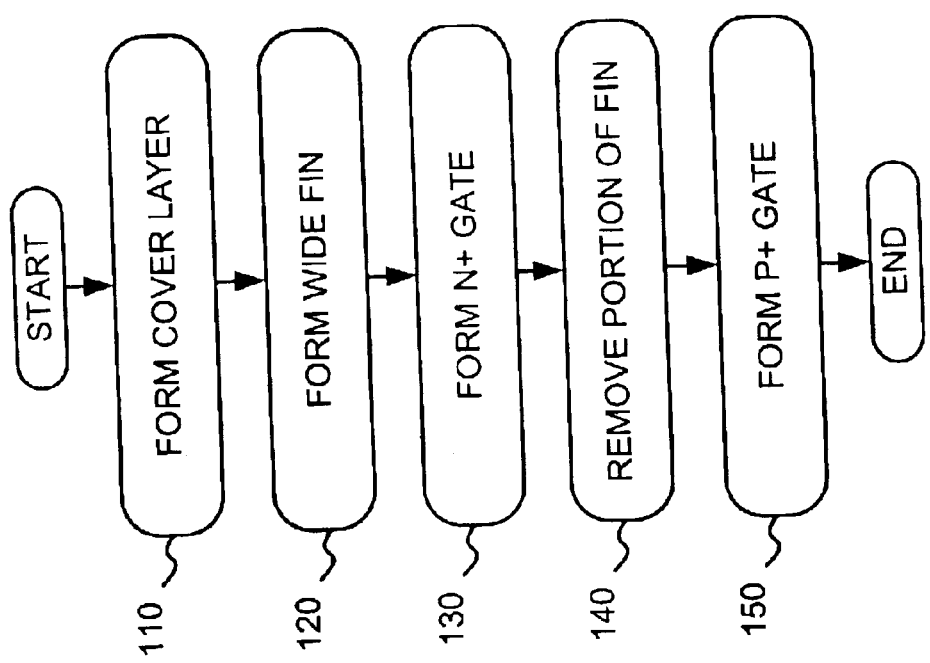
FIG. 1 illustrates an exemplary process for fabricating an asymmetric double gate MOSFET in an implementation consistent with the principles of the invention.

FIG. 1 illustrates an exemplary process for fabricating an asymmetric double gate MOSFET in an implementation consistent with the principles of the invention. FIGS. 2–9 illustrate exemplary cross-sectional views of a MOSFET fabricated according to the processing described with regard to FIG. 1.

Figure 2:
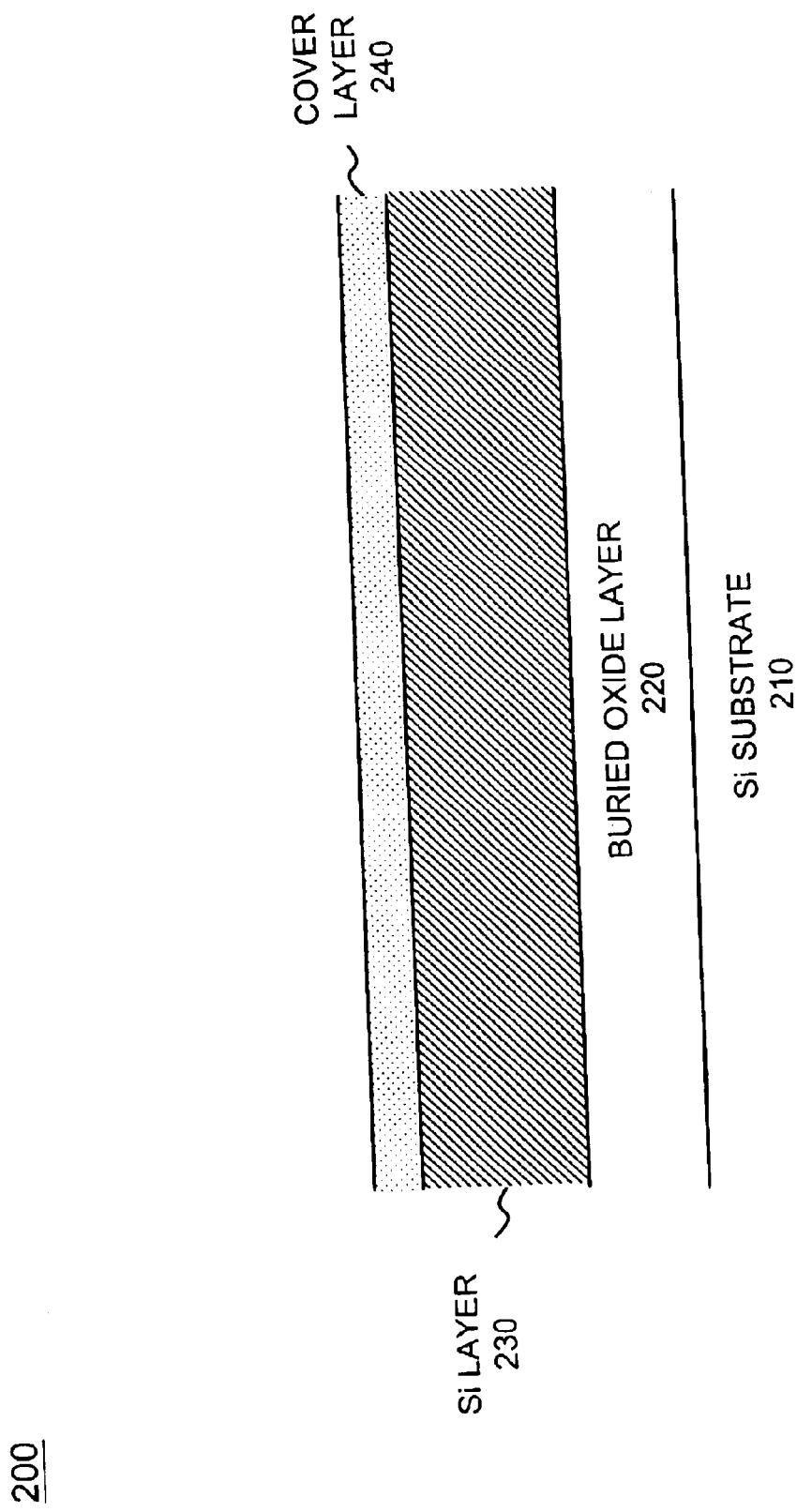
FIGS. 2–9 illustrate exemplary cross-sectional views of a double gate MOSFET fabricated according to the processing described in FIG. 1.

With reference to FIGS. 1 and 2, processing may begin with semiconductor device 200. Semiconductor device 200 may include a silicon on insulator (SOI) structure that includes a silicon substrate 210, a buried oxide layer 220, and a silicon layer 230 on the buried oxide layer 220. Buried oxide layer 220 and silicon layer 230 may be formed on substrate 210 in a conventional manner. The thickness of buried oxide layer 220 may range, for example, from about 1000 Å to 4000 Å. The thickness of silicon layer 230 may range from about 200 Å to 1500 Å. It will be appreciated that silicon layer 230 is used to form the fin. In alternative implementations, substrate 210 and layer 230 may include other semiconductor materials, such as germanium, or combinations of semiconductor materials, such as silicon-germanium. Buried oxide layer 220 may include a silicon oxide or other types of dielectric materials.

A cover layer 240 (or hard mask) may be formed on top of silicon layer 230 to aid in pattern optimization and protect silicon layer 230 during subsequent processing (act 110). Cover layer 240 may, for example, include a silicon nitride material or some other type of material capable of protecting silicon layer 230 during the fabrication process. Cover layer 240 may be deposited, for example, by chemical vapor deposition (CVD) at a thickness ranging from approximately 200 Å to 500 Å.

Figure 3:
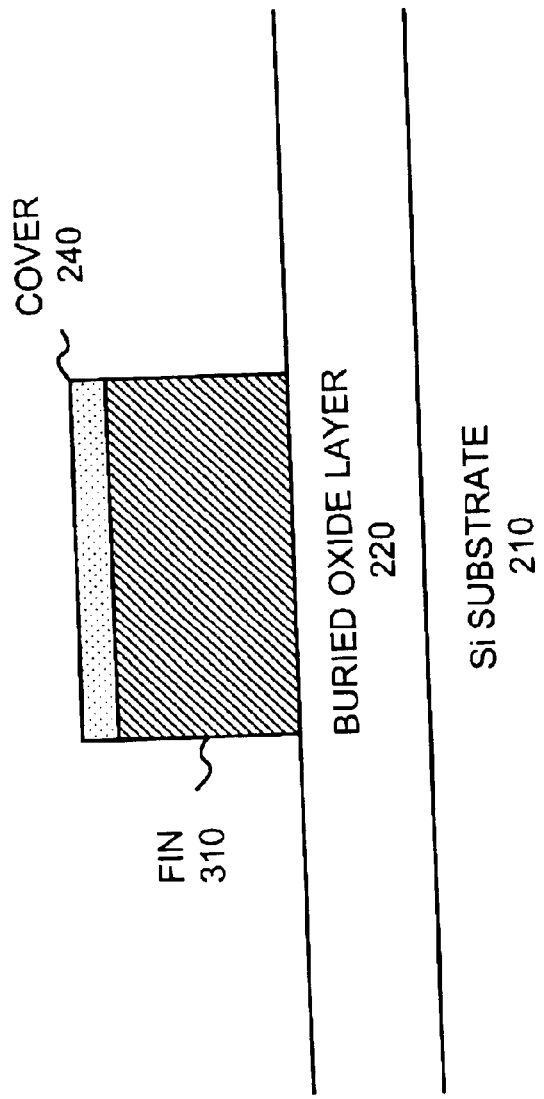

Silicon layer 230 may be patterned by conventional lithographic techniques (e.g., optical or electron beam (EB) lithography). Silicon layer 230 may then be etched using well-known etching techniques to form a wide fin 310 (act 120), as illustrated in FIG. 3. Cover 240 may remain covering fin 310. The width of fin 310 may range from approximately 800 Å to 2000 Å.

Figure 4:
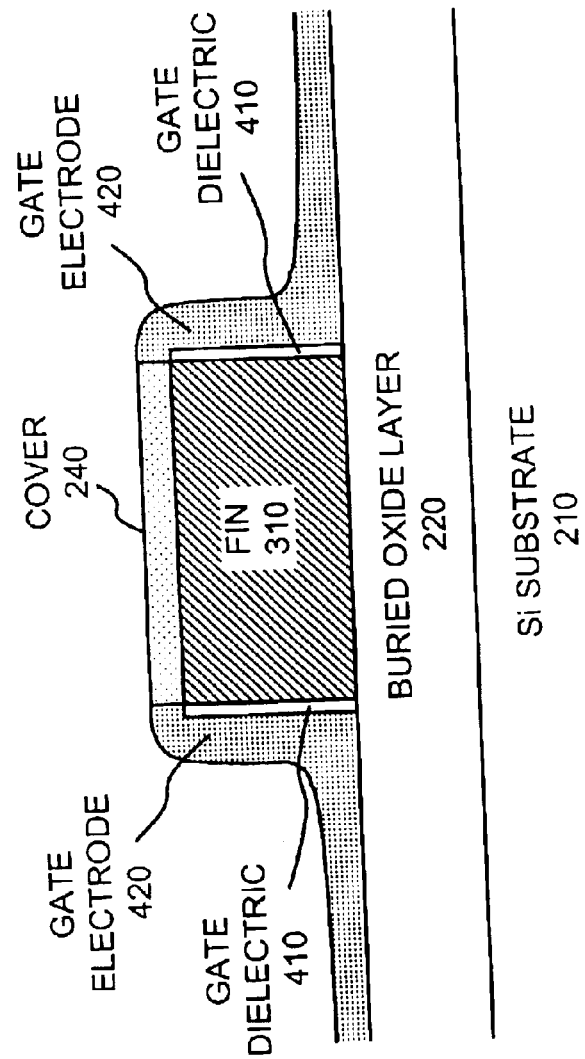

Following the formation of fin 310, an n+ gate may be formed (act 130). For example, a gate dielectric material 410 may be deposited or thermally grown on the side surfaces of fin 310 using known techniques, as illustrated in FIG. 4. Gate dielectric material 410 may include-dielectric materials, such as an SiON or high-K materials (with Hf, Zr, Y, La oxide) by atomic layer deposition (ALD) or molecular organic chemical vapor deposition (MOCVD). In other implementations, a silicon nitride or other materials may be used to form the gate dielectric. Gate dielectric material 410 may be formed at an equivalent oxide thickness (EOT) ranging from approximately 6 Å to 18 Å.

A gate electrode material may then be deposited over semiconductor device 200 and planarized to form gate electrodes 420 adjacent gate dielectric material 410 on side surfaces of fin 310, as illustrated in FIG. 4. The gate electrode material may be planarized (e.g., via chemical-mechanical polishing (CMP)) to remove any gate material over the top of cover 240, as illustrated in FIG. 4. A number of materials may be used for gate electrodes 420. For example, gate electrodes 420 may include an undoped polycrystalline silicon or other types of conductive material, such as germanium or combinations of silicon and germanium. Gate electrodes 420 may be formed at a thickness ranging from approximately 1000 Å to 1500 Å.

Figure 5:
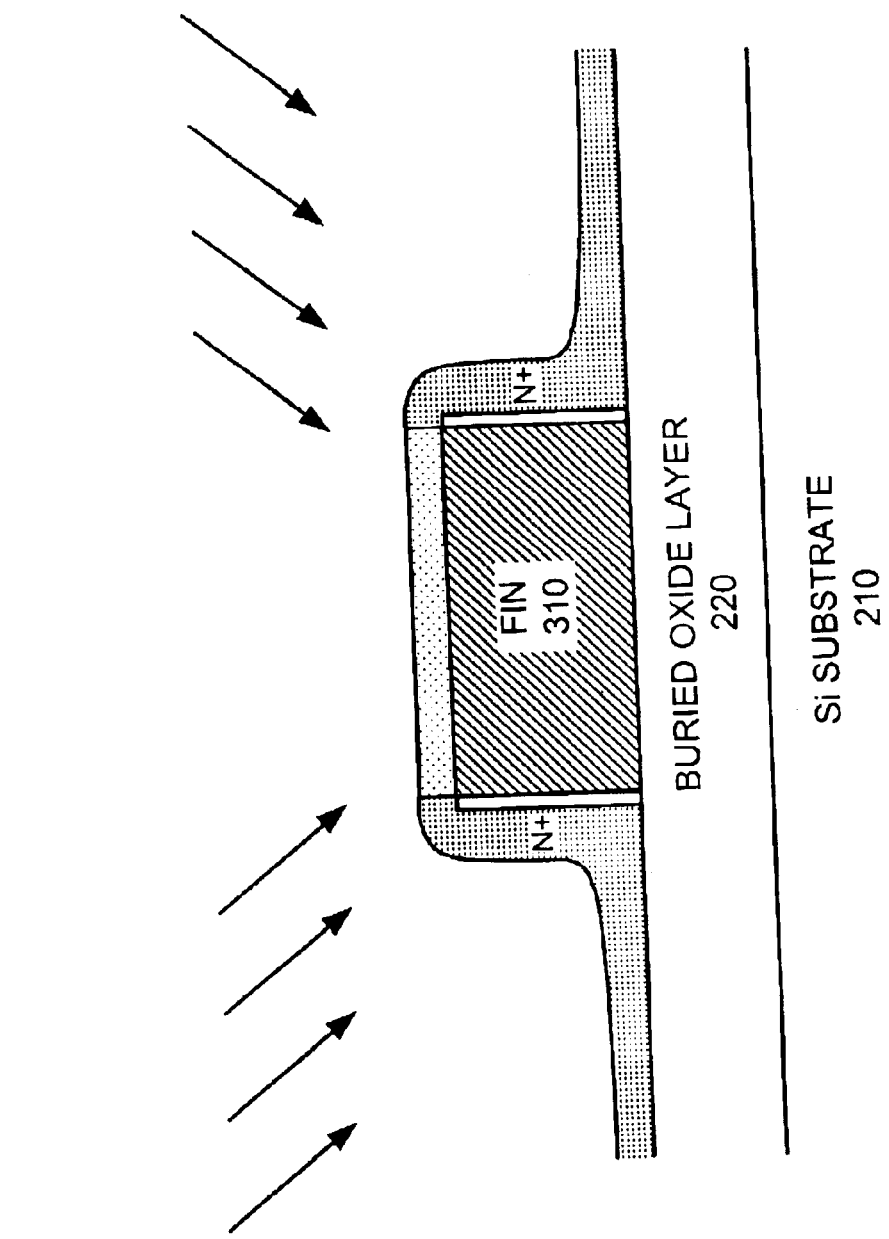

Gate electrodes 420 may then be doped using a conventional implant process with tilted angles (30–45 degree) separately from the left and right sides, as illustrated in FIG. 5. For example, n-type impurities, such as arsenic or phosphorus, may be implanted at a dosage of about $5\times10^{14}$ atoms/cm$^2$ to about $1\times10^{16}$ atoms/cm$^2$ and an implantation energy of about 5 KeV to about 20 KeV depending on the thickness of gate electrode. After the implant process is complete, gate electrodes 420 may include silicon doped predominately, or only, with n-type impurities to form an n+ gate, as illustrated in FIG. 5. In alternative implementations, the deposited gate electrode material may already be doped with n-type impurities.

Figure 6:
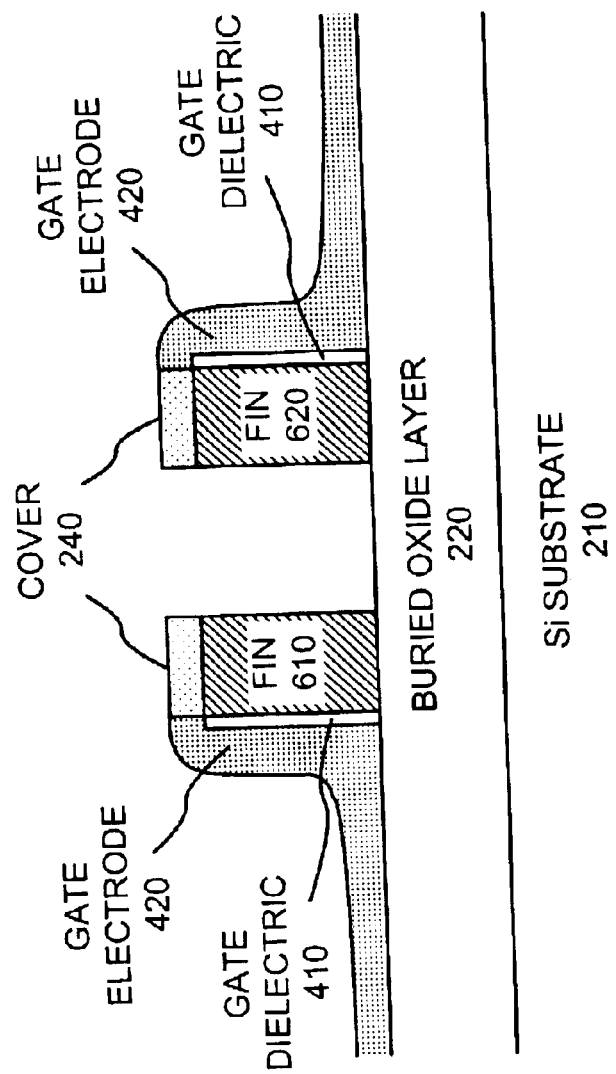

A portion of fin 310 may then be removed (act 140), as illustrated in FIG. 6. For example, a conventional patterning technique and etching technique may be used to remove a portion of cover 240 and fin 310, while minimizing effects to the n+gate. The etching of fin 310 may terminate on buried oxide layer 220, as illustrated in FIG. 6, to form two separate fins 610 and 620. Each of fins 610 and 620 may have a width ranging from approximately 50 Å to 250 Å.

The space between fins 610 and 620 may range from approximately 700 Å to 1500 Å. As shown in FIG. 6, two separate fins are formed. In other implementations, more than two fins may be formed.

Figure 7:
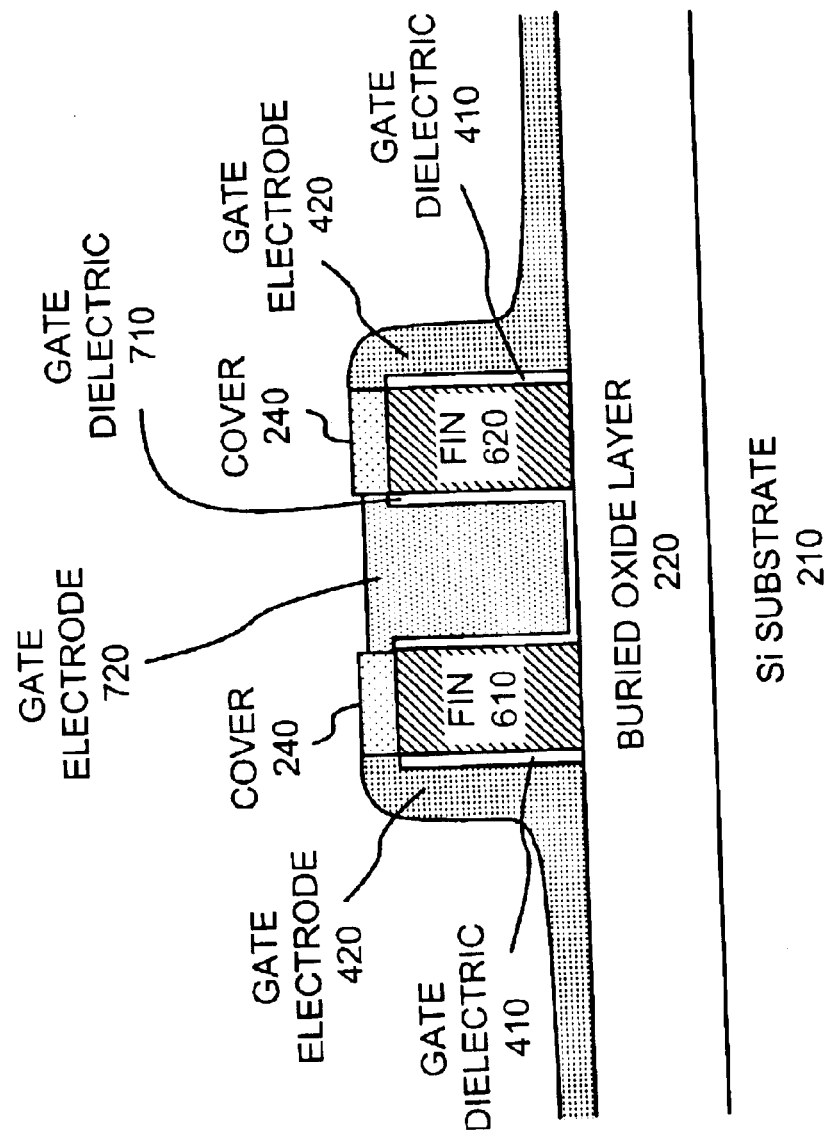
Figure 8:
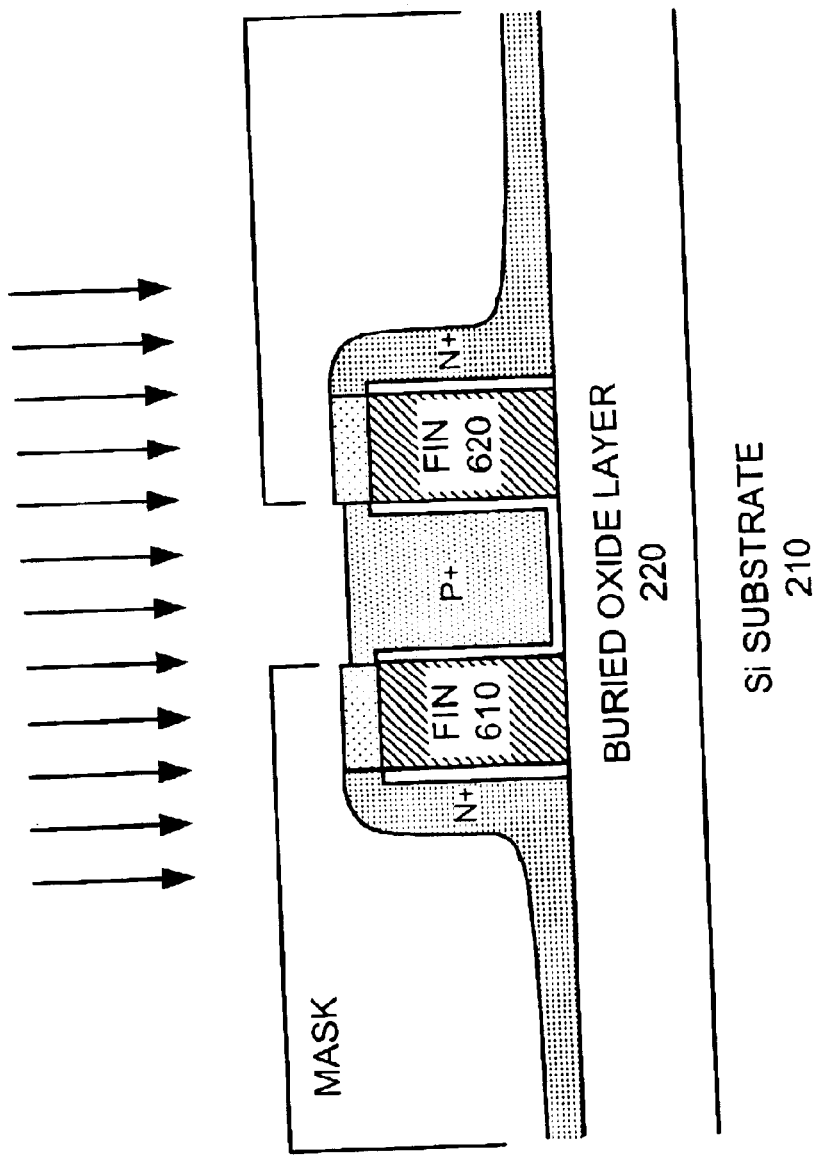

A p+ gate may then be formed (act 150), as illustrated in FIGS. 7 and 8. For example, a gate dielectric material 710 may be thermally grown on the exposed surfaces of fins 610 and 620, as illustrated in FIG. 7. Gate dielectric 710 may include a material similar to that used for gate dielectric 410 or another type of dielectric material. Gate dielectric material 710 maybe grown to an EOT of about 6 Å to about 18 Å.

Gate electrode material 720 may then be deposited to fill the space between fins 610 and 620, as illustrated in FIG. 7. Gate electrode material 720 may include a material similar to the material used for gate electrode 420 or another type of gate material and may be deposited to a thickness ranging from approximately 700 Å to 1500 Å.

Gate electrode material 720 may be doped using a conventional implant process, as illustrated in FIG. 8. For example, p-type impurities, such as boron or BF$_2$, may be implanted at a dosage of about $5\times10^{14}$ atoms/cm$^2$ to about $5\times10^{15}$ atoms/cm$^2$ and an implantation energy of about 5 KeV to about 20 KeV. A mask, or the like, may be used to protect other portions of semiconductor device 200, such as the n+ gate, during the implant process. In other implementations, the deposited gate material may already be doped with p-type impurities. Gate electrode material 720 may then be patterned and etched to form a gate structure. The resulting gate structure may include silicon doped predominately, or only, with p-type impurities to form a p+ gate, as illustrated in FIG. 8.

Figure 9:
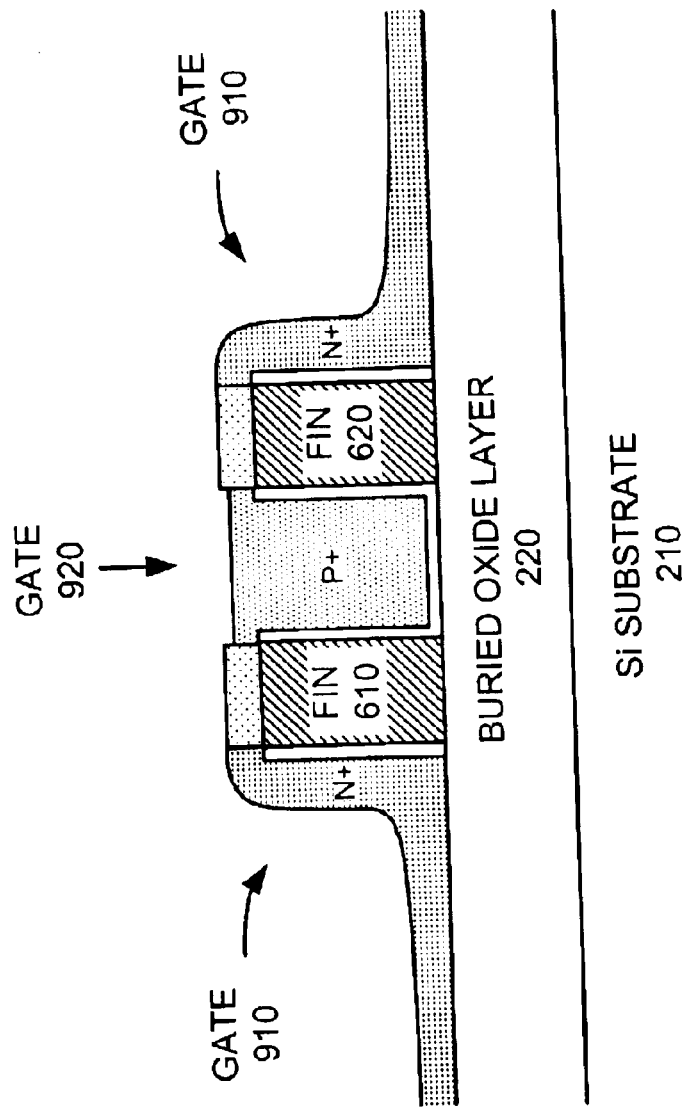

The resulting semiconductor device 200 may include two gates (i.e., n+ gate 910 and p+ gate 920), as illustrated in FIG. 9. Conventional MOSFET fabrication processing can then be used to complete the transistor (e.g., forming the source and drain regions), contacts, interconnects and inter-level dielectrics for the asymmetric double gate MOSFET. Advantageously, gates 910 and 920 may be independently biased during circuit operation.

All-around Gate MOSFET

Figure 10:
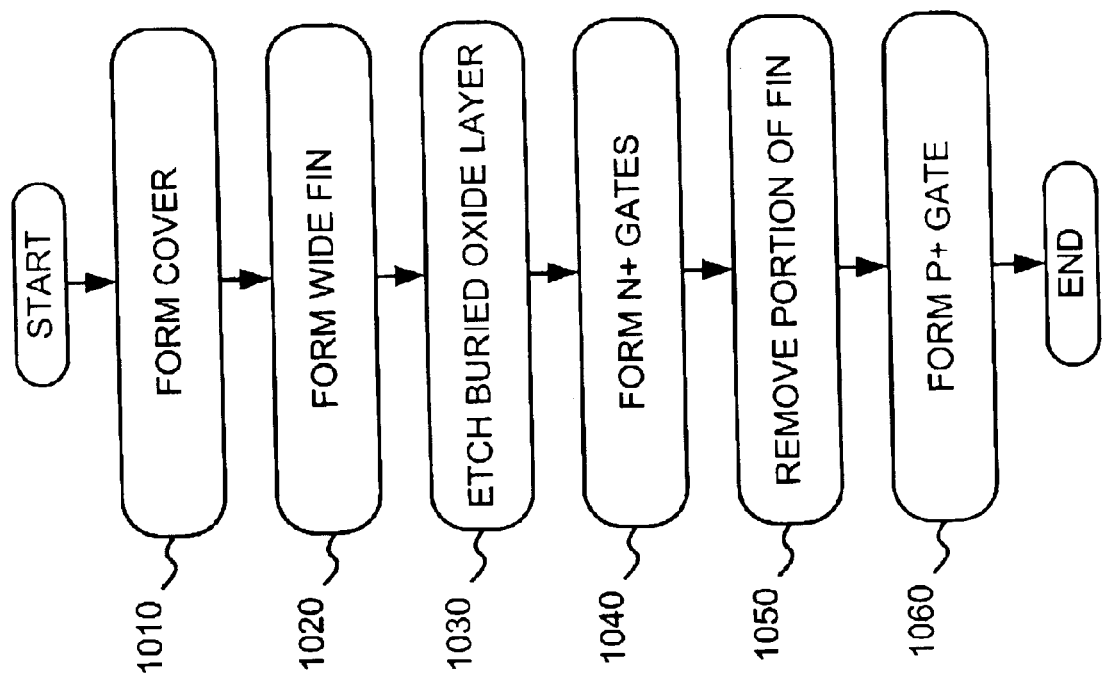
FIG. 10 illustrates an exemplary process for fabricating an asymmetric all-around gate MOSFET in an implementation consistent with the principles of the invention.
Figure 11:
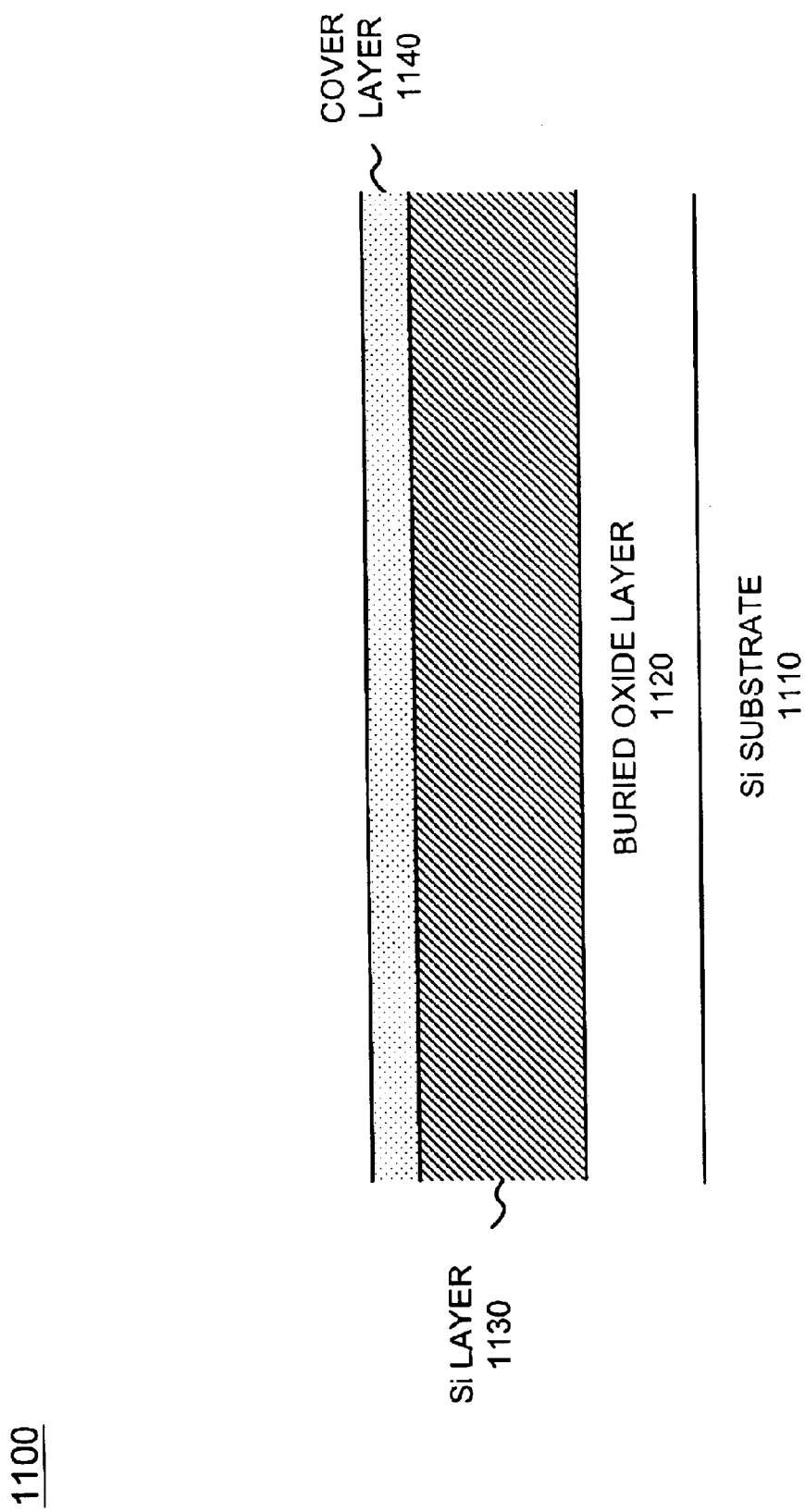
FIGS. 11–18 illustrate exemplary cross-sectional views of an all-around gate MOSFET fabricated according to the processing described in FIG. 10.

FIG. 10 illustrates an exemplary process for fabricating an asymmetric all-around gate MOSFET in an implementation consistent with the principles of the invention. FIGS. 11–18 illustrate exemplary cross-sectional views of an all-around gate MOSFET fabricated according to the processing described with respect to FIG. 10. Processing may begin with semiconductor device 1100. Semiconductor device 1100 may include a SOI structure that includes silicon substrate 1110, buried oxide layer 1120, and silicon layer 1130. The SOI structure may be similar to the one described with respect to FIG. 2.

A cover layer 1140 (or hard mask) may be formed on top of silicon layer 1130 to aid in pattern optimization and protect silicon layer 1130 during subsequent processing (act 1010). Cover layer 1140 may, for example, include a silicon nitride material or some other type of material capable of protecting silicon layer 1130 during the fabrication process. Cover layer 1140 may be deposited, for example, by CVD at a thickness ranging from approximately 200 Å to 500 Å.

Figure 12:
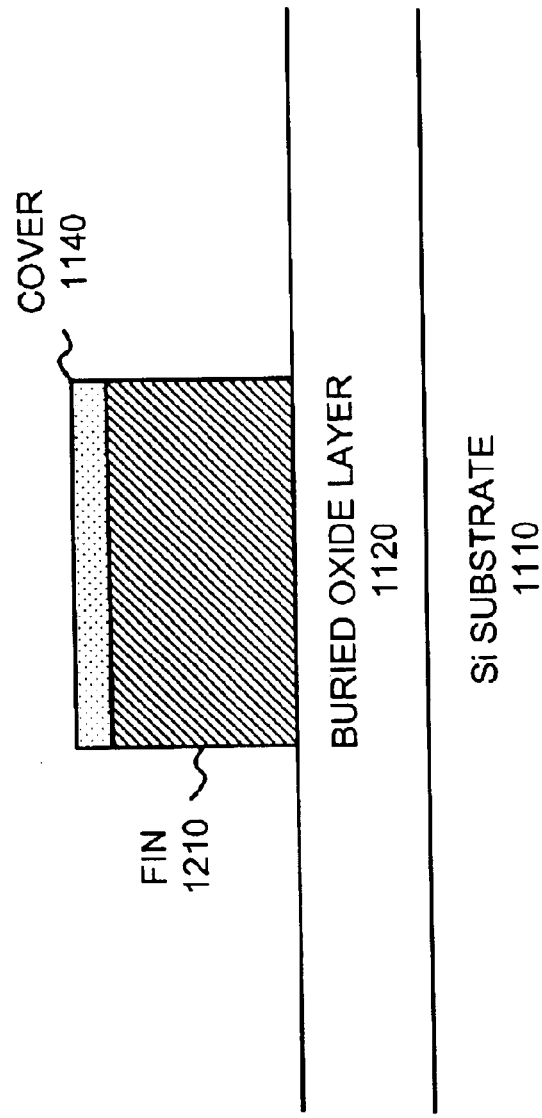

Silicon layer 1130 may be patterned by conventional lithographic techniques (e.g., optical or electron beam lithography). Silicon layer 1130 may then be etched using well-known etching techniques to form a wide fin 1210 (act 1020), as illustrated in FIG. 12. Cover 1140 may remain covering fin 1210. The width of fin 1210 may range from approximately 800 Å to 2000 Å.

Figure 13:
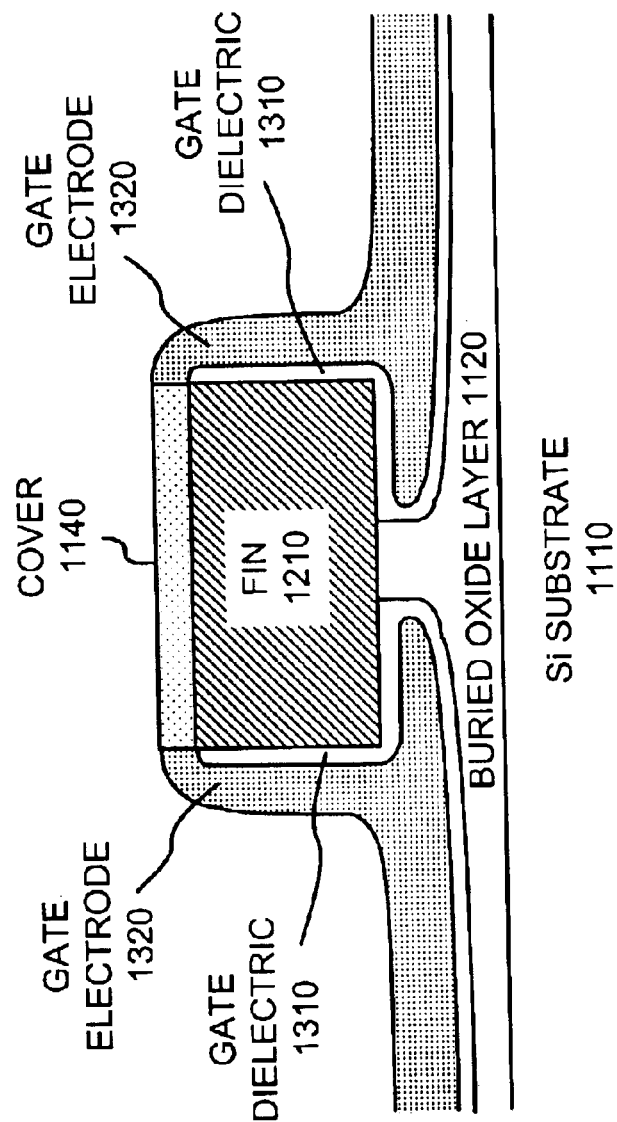

Following the formation of fin 1210, a portion of buried oxide layer 1120 may be removed using, for example, one or more conventional etching techniques (act 1030), as illustrated in FIG. 13. In one implementation, buried oxide layer 1120 may be etched to a depth ranging from about 1000 Å to about 4000 Å. During the etching, a portion of buried oxide layer 1120 below fin 1210 may be removed, as illustrated in FIG. 13. For example, the etched portion of buried oxide layer 1120 may extend laterally below tin 1210. In one implementation, the etched portion may extend laterally below fin 1210 about half of the width of fin 1210. The remaining portion of buried oxide layer 1120 located below fin 1210 may be as small as about 0 Å, as fin 1210 is held by silicon along the source/drain direction.

Figure 14:
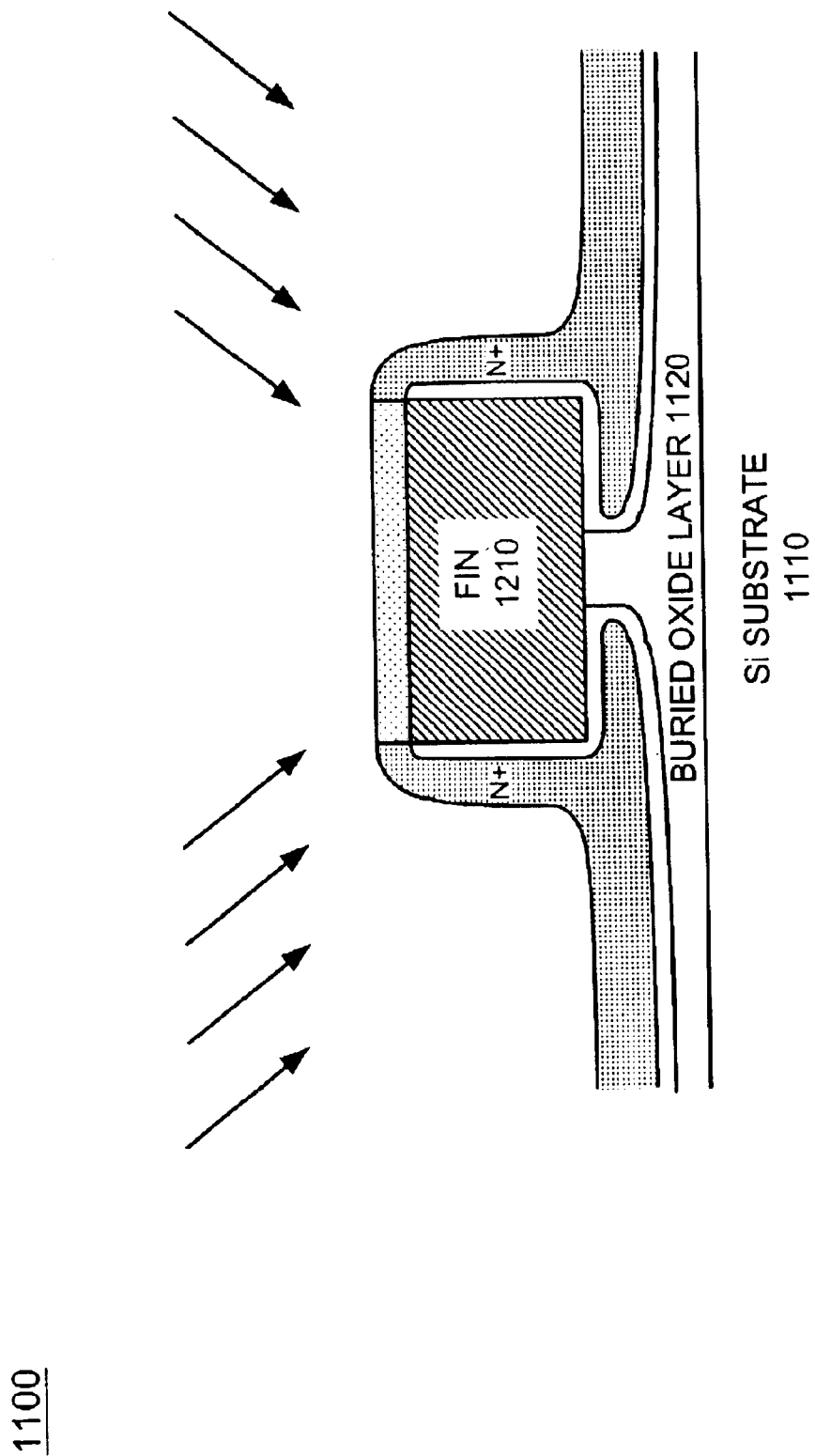

N+ gates may then be formed (act 1040), as illustrated in FIGS. 13 and 14. For example, a gate dielectric material 1310 may be deposited or thermally grown using known techniques, as illustrated in FIG. 13. Gate dielectric material 1310 may include conventional dielectric materials, such as an oxide (e.g., silicon dioxide). In other implementations, a silicon nitride or another type of material may he used as the gate dielectric material. In yet other implementations, gate dielectric material 1310 may include a material similar to that used for gate dielectric material 410. Gate dielectric material 1310 may be formed at a thickness ranging from approximately 6 Å to 18 Å.

A gate electrode material may then be deposited over semiconductor device 1100 and planarized to form gate electrodes 1320 adjacent gate dielectric material 1310 on side surfaces of fin 1210, as illustrated in FIG. 13. The gate electrode material may be planarized (e.g., via CMP) to expose cover 1140, as illustrated in FIG. 13. A number of materials may be used for the gate electrode material. For example, the gate electrode material may include an undoped polycrystalline silicon or other types of conductive material, such as germanium or combinations of silicon and germanium. Gate electrodes 1320 may be formed at a thickness ranging from approximately 1000 Å to 1500 Å.

Gate electrodes 1320 may then be doped using a conventional implant process with tilted angles (30–45 degree) separately from the left and right sides, as illustrated in FIG. 14. For example, n-type impurities, such as arsenic or phosphorus, may be implanted at a dosage of about $5\times10^{14}$ atoms/cm$^2$ to about $1\times10^{16}$ atoms/cm$^2$ and an implantation energy of about 5 KeV to about 30 KeV. After the implant process is complete, gate electrodes 1320 may include silicon doped predominately, or only, with n-type impurities to form n+ gates, as illustrated in FIG. 14. In alternative implementations, the deposited gate electrode material may already be doped with n-type impurities.

Figure 15:
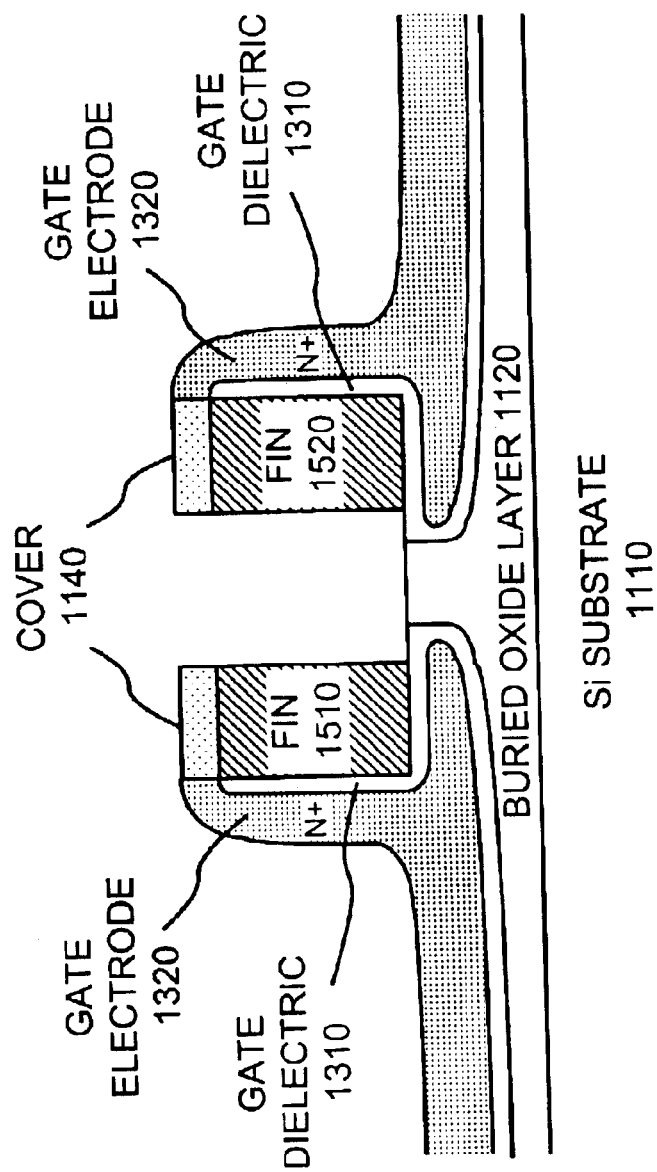

A portion of fin 1210 may then be removed (act 1050), as illustrated in FIG. 15. For example, a conventional patterning technique and etching technique may be used to remove a portion of cover 1140 and fin 1210, while minimizing effects to the n+ gates. The etching of fin 1210 may terminate on buried oxide layer 1120, as illustrated in FIG. 15, to form two separate fins 1510 and 1520. Each of fins 1510 and 1520 may have a width ranging from approximately 50 Å to 250 Å. The space between fins 1510 and 1520 may range from approximately 700 Å to 1500 Å. As shown in FIG. 15, two separate fins are formed. In other implementations, more than two fins may be formed.

Figure 16:
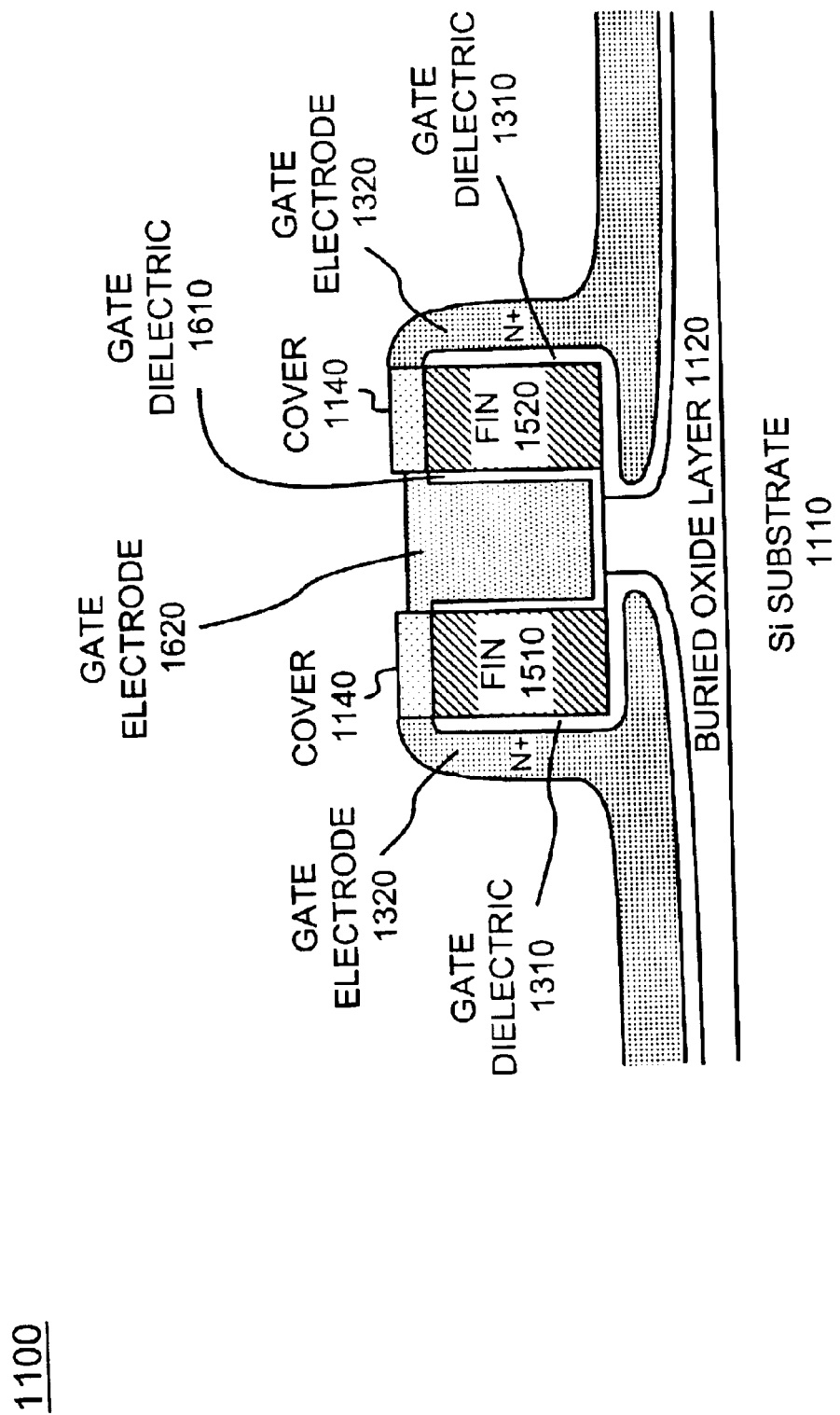
Figure 17:
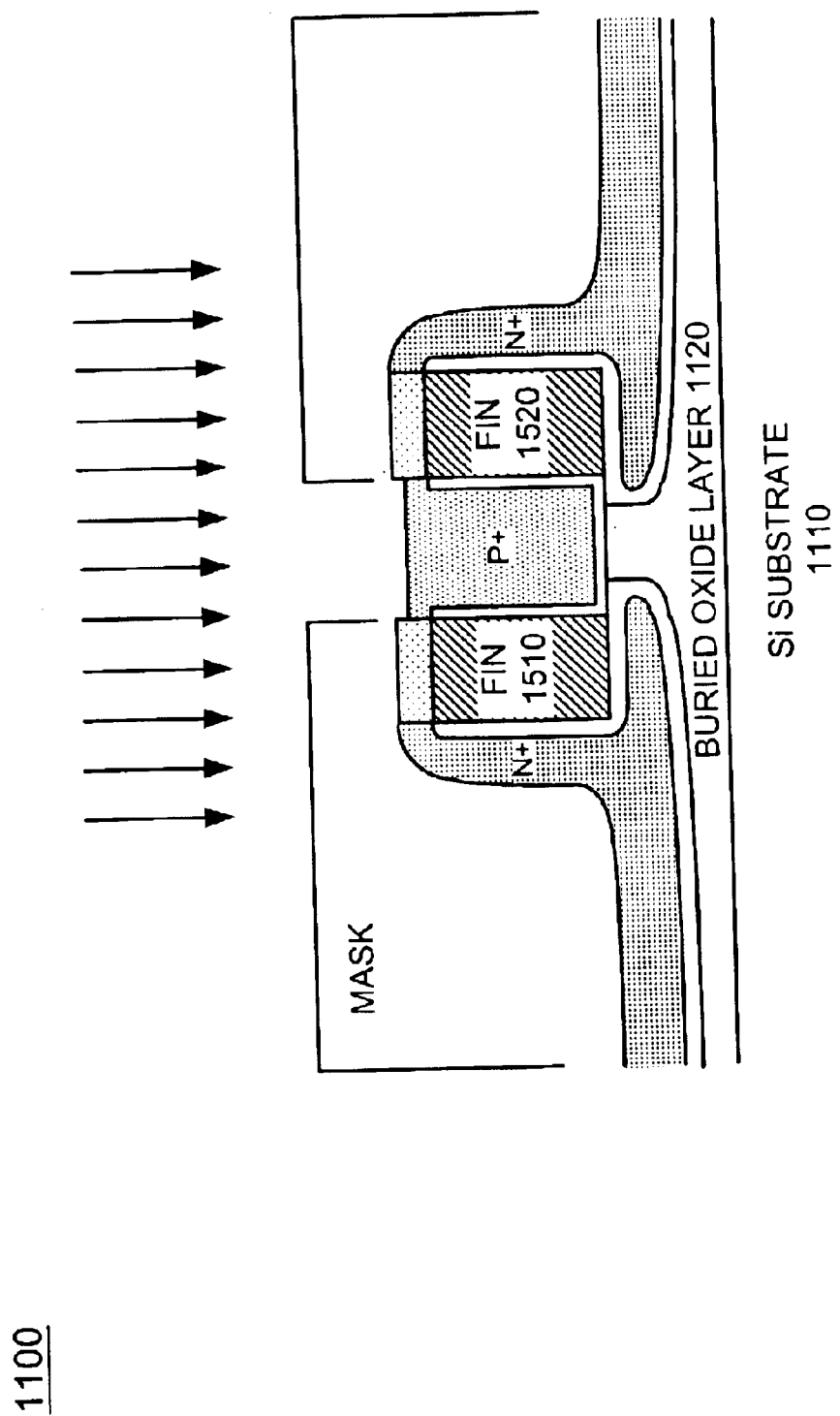

A p+ gate may then be formed (act 1060), as illustrated in FIGS. 16 and 17. For example, a gate dielectric material 1610 may be thermally grown on the exposed surfaces of fins 1510 and 1520, as illustrated in FIG. 16. Gate dielectric 1610 may include a material similar to that used for gate dielectric 1310 or another type of dielectric material. Gate dielectric material 1610 may be grown to an EOT thickness of about 6 Å to about 18 Å.

Gate electrode material 1620 may then be deposited to fill the space between fins 1510 and 1520, as illustrated in FIG. 16. Gate electrode material 1620 may include a material similar to the material used for gate electrode material 1320 or another type of electrode material and may be deposited to a thickness ranging from approximately 700 Å to 1500 Å.

Gate electrode material 1620 may be doped using a conventional implant process, as illustrated in FIG. 17. For example, p-type impurities, such as boron or BF$_2$, may be implanted at a dosage of about $5\times10^{14}$ atoms/cm$^2$ to about $5\times10^{15}$ atoms/cm$^2$ and an implantation energy of about 5 KeV to about 20 KeV. A mask, or the like, may be used to protect portions of semiconductor device 1100 during the implant process. In other implementations, the deposited gate electrode material may already be doped with p-type impurities. Gate electrode material 1620 may then be patterned and etched to form a gate structure. The resulting gate structure may include silicon doped predominately, or only, with p-type impurities to form a p+ gate, as illustrated in FIG. 17.

Figure 18:
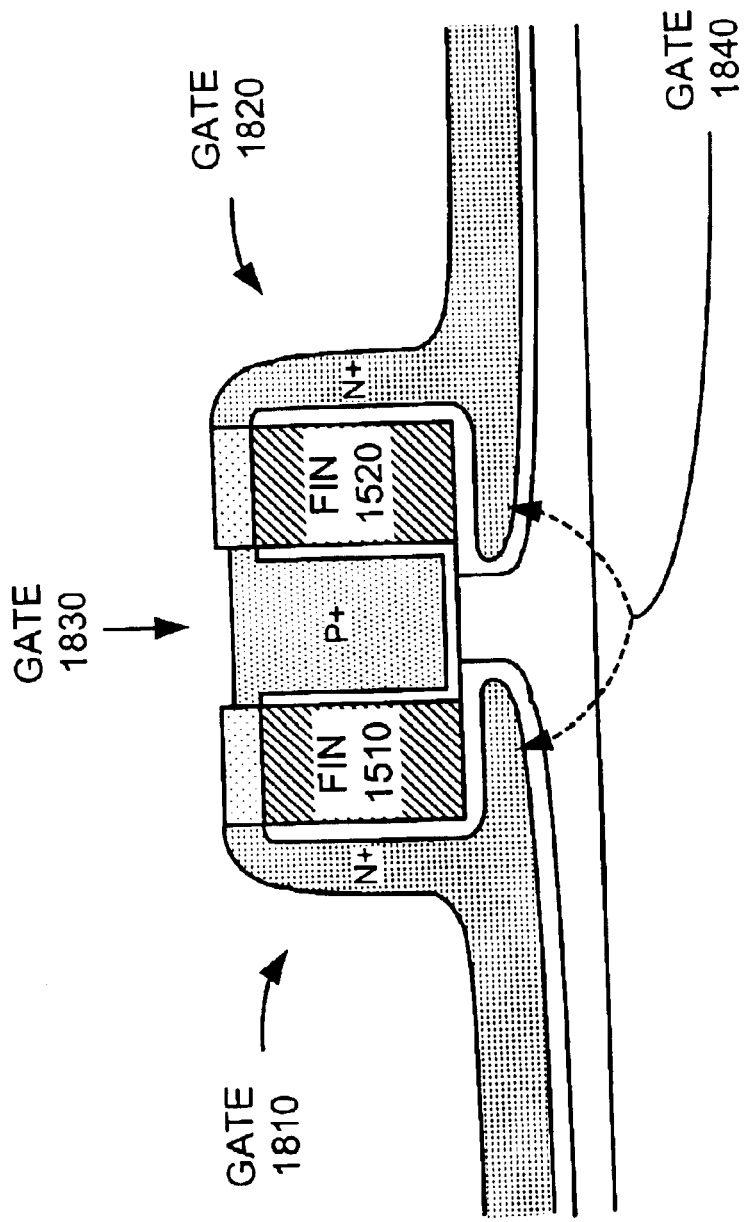

The resulting semiconductor device 1100 may include four (or more) gates (i.e., n+ gate 1810, n+ gate 1820, p+ gate 1830, and n+ gate 1840, as illustrated in FIG. 18. N+ gate 1840 may at least partially be formed under fin 1510 and/or fin 1520. Conventional MOSFET fabrication processing can then be used to complete the transistor (e.g., forming the source and drain regions), contacts, interconnects and inter-level dielectrics for the asymmetric all-around gate MOSFET. Advantageously, gates 1810–1840 may be independently biased during circuit operation.

Other Implementations

Figure 19:
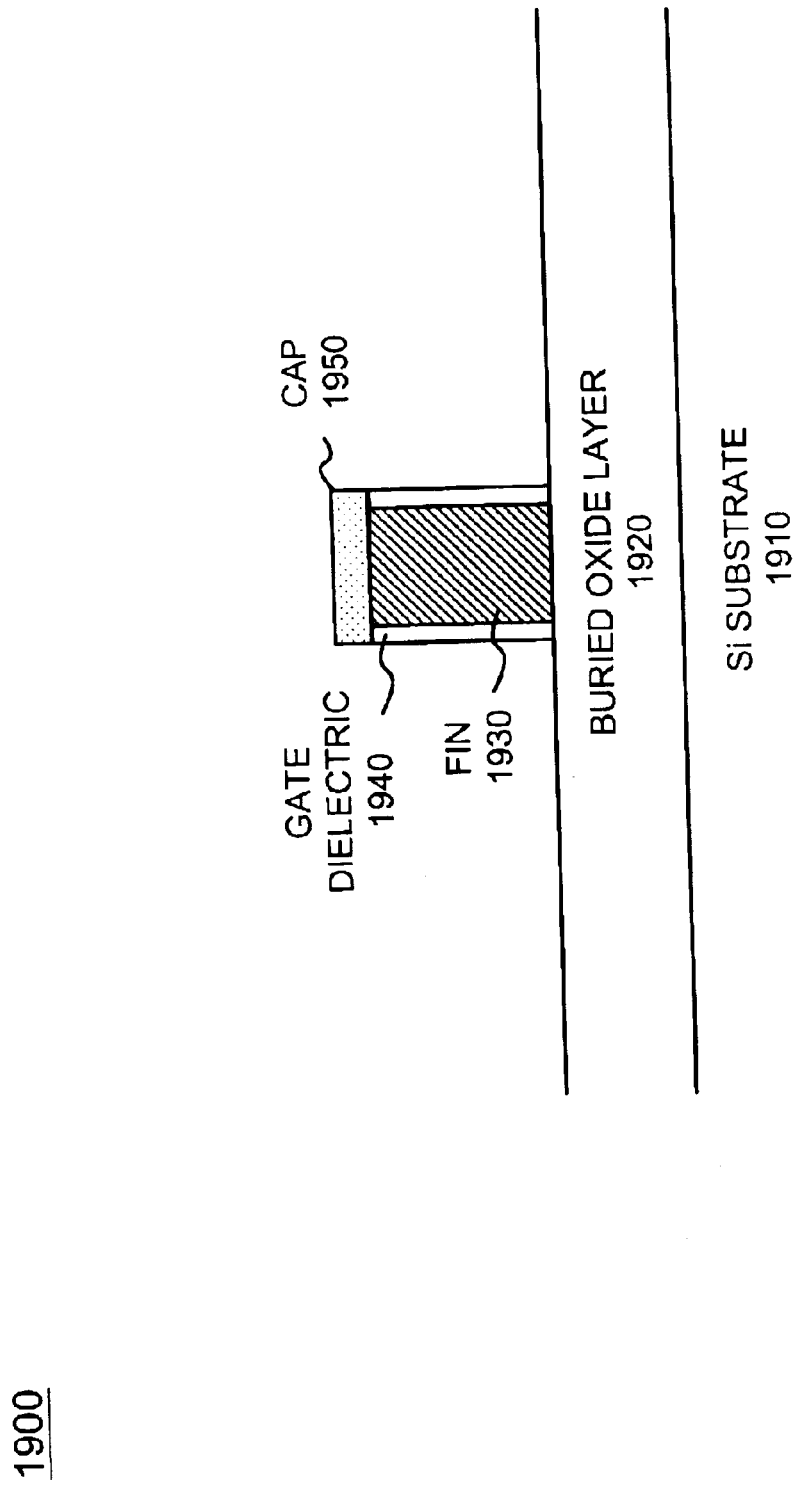
FIGS. 19–24 illustrate an exemplary process for forming a double gate MOSFET with asymmetric polysilicon gates.

Another type of double gate MOSFET with asymmetric polysilicon gates is described with regard FIGS. 19–24. FIGS. 19–24 illustrate an exemplary process for forming a double gate MOSFET with asymmetric polysilicon gates. As shown in FIG. 19, a fin 1930 may be formed on a substrate, such as a SOI substrate that includes a silicon substrate 1910 and a buried oxide layer 1920. Fin 1930 may be formed using, for example, processes similar to those described above with regard to earlier implementations. A gate dielectric material 1940 may be formed or grown on side surfaces of fin 1930. A protective cap 1950 may be formed over fin 1930 and gate dielectric 1940. Cap 1950 may include a silicon nitride and may function as a bottom antireflective coating (BARC) for subsequent processing.

Figure 20:
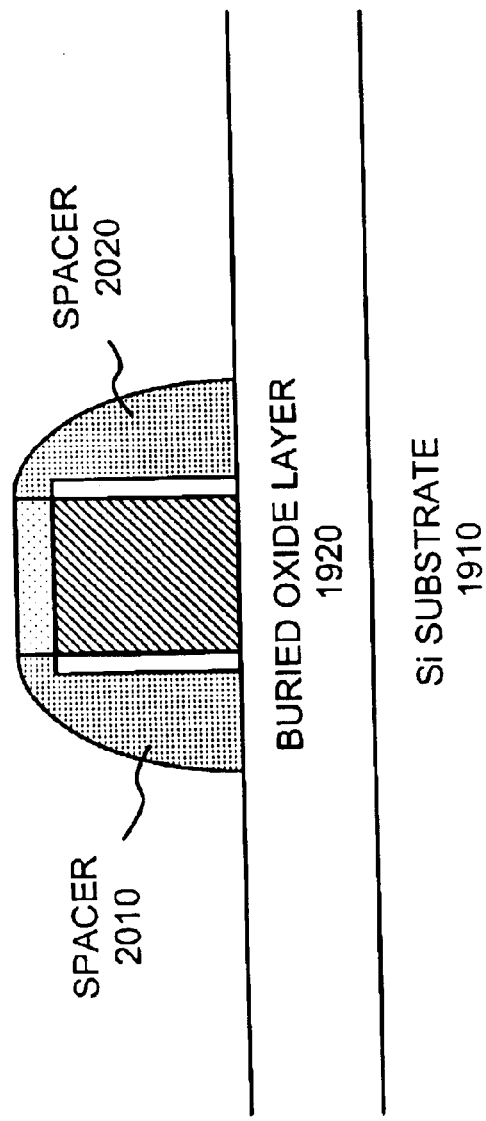
Figure 21:
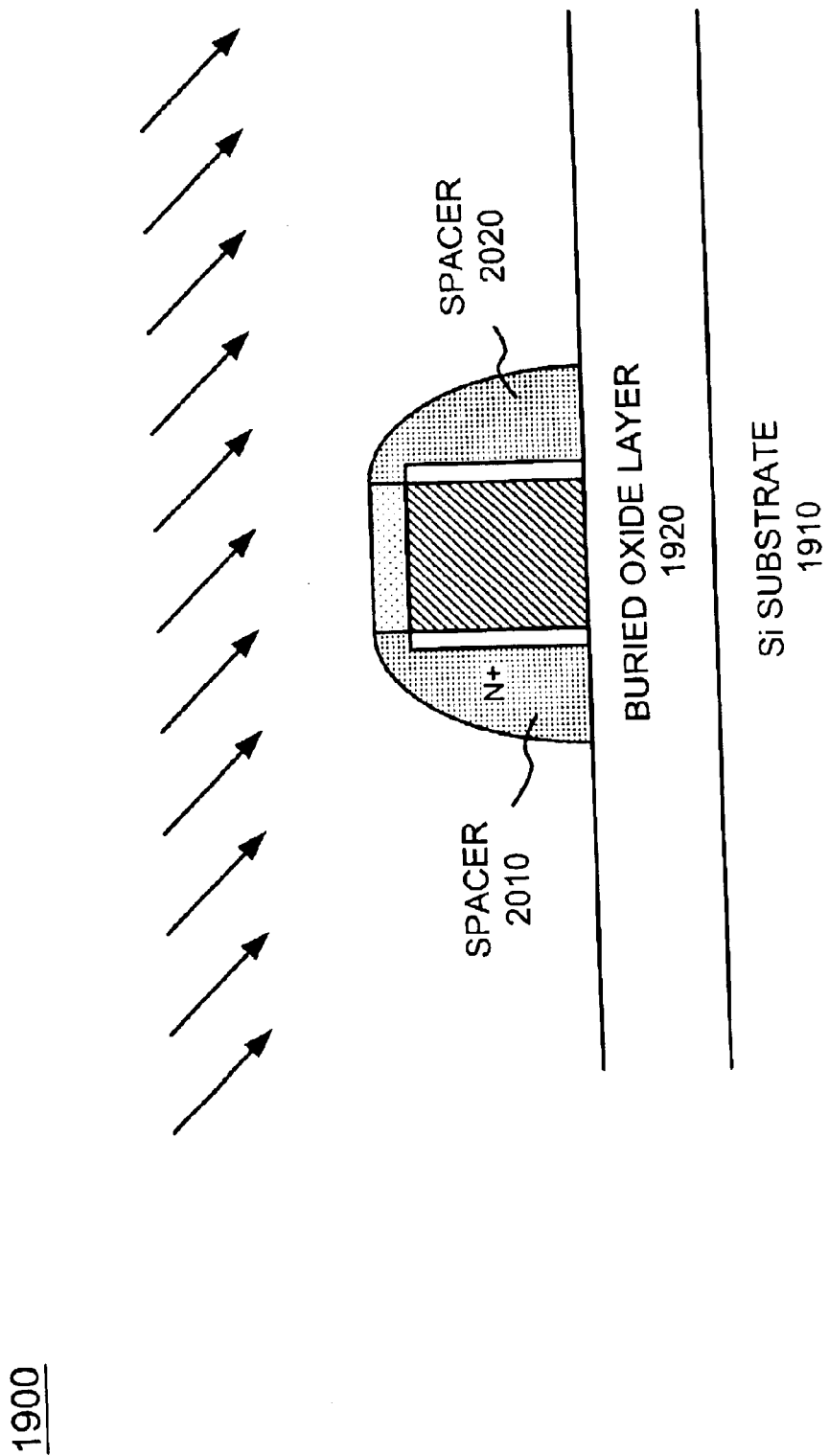
Figure 22:
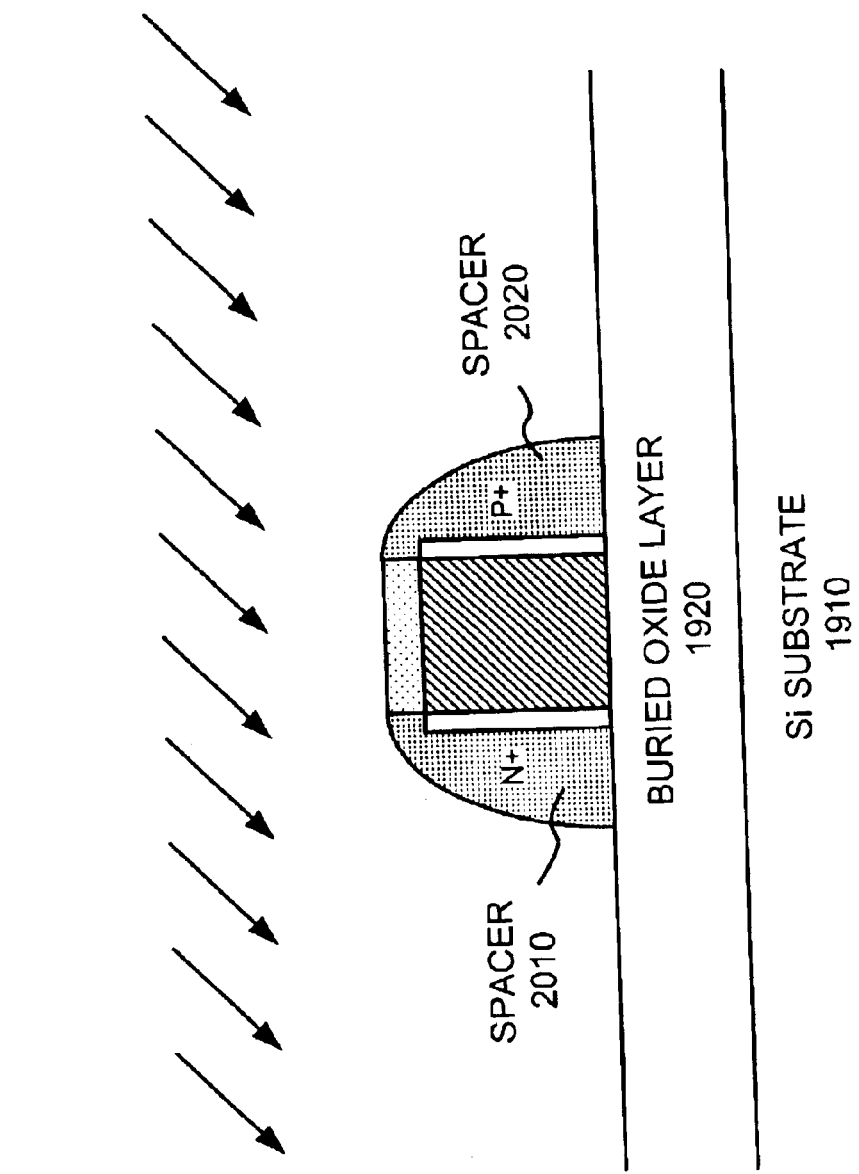

A gate electrode material may then be deposited over semiconductor device 1900 and etched to form spacers 2010 and 2020 adjacent gate dielectric material 1940 on side surfaces of fin 1930, as illustrated in FIG. 20. Spacers 2010 and 2020 may then be doped using a tilt angle implant process, as illustrated in FIGS. 21 and 22. For example, n-type impurities, such as arsenic or phosphorous, may be implanted such that only a small percentage of the n-type impurities, if any, will reach spacer 2020 as the majority of spacer 2020 will be shielded from the implantation by fin 1930 and cap 1950. Next, p-type impurities, such as, for example, boron or BF$_2$, may be implanted such that only a small percentage of the p-type impurities, if any, reach spacer 2010, as the majority of spacer 2010 will be shielded from the implantation by fin 1930 and cap 1950. After the tilt angle implant processes are complete, spacer 2010 comprises silicon doped predominately with, or only with, n-type impurities and spacer 2020 comprises silicon doped predominately with, or only with, p-type impurities.

Figure 23:
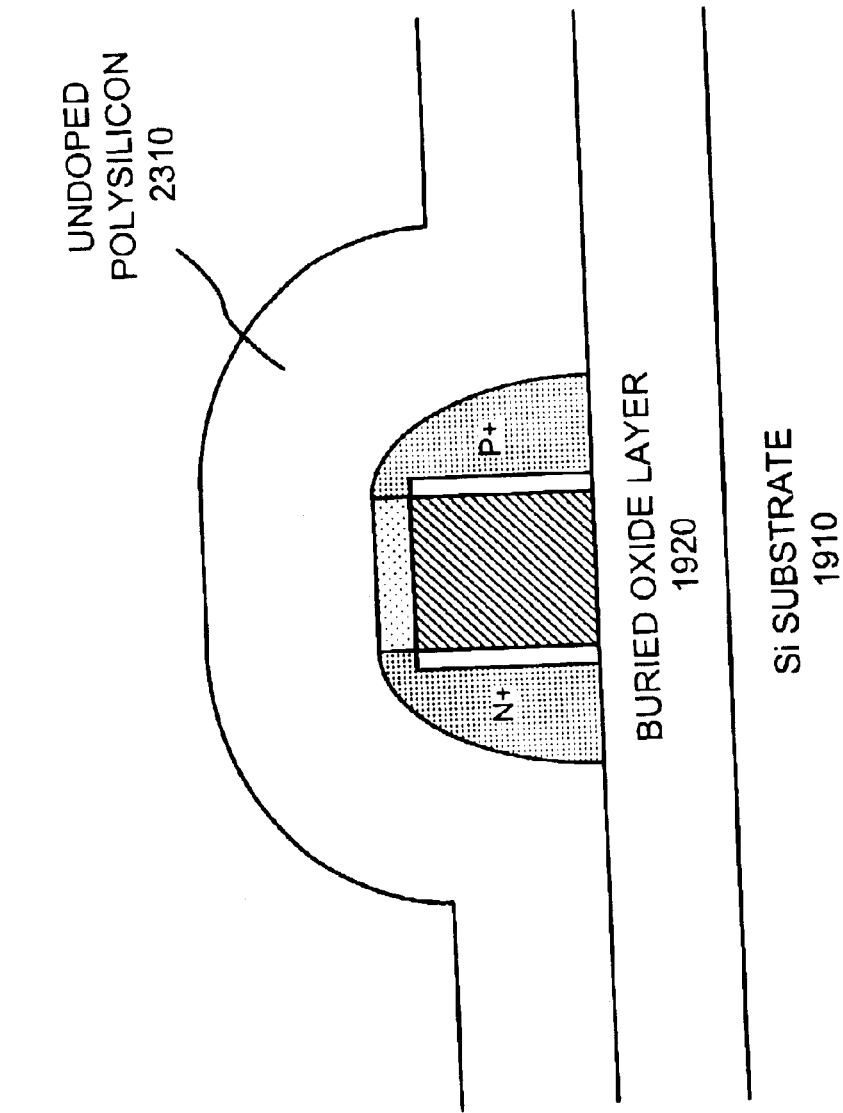
Figure 24:
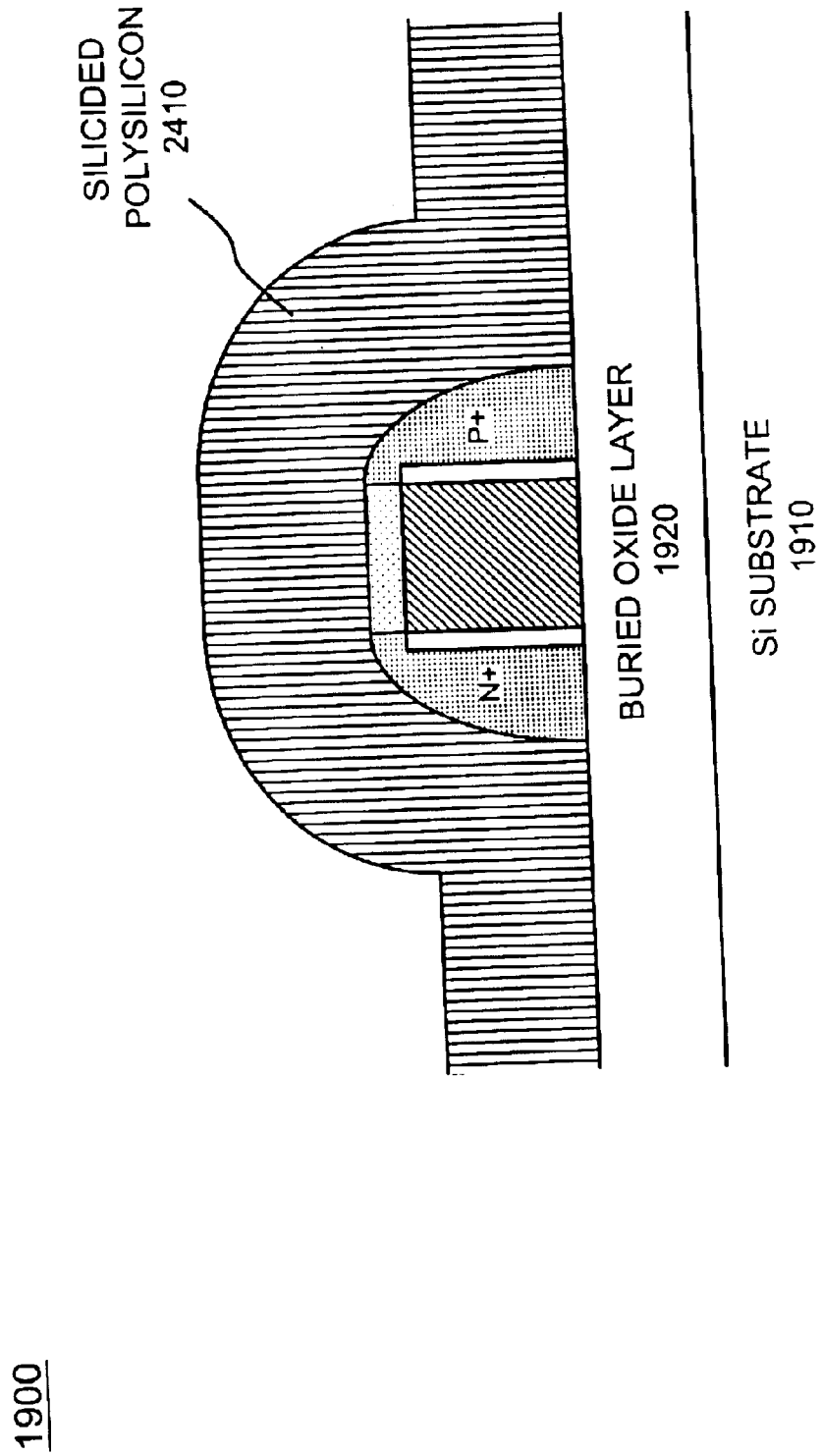

An undoped polysilicon layer 2310 may be deposited over semiconductor 1900, as illustrated in FIG. 23. Polysilicon layer 2310 may then be silicided by depositing a metal, followed by an annealing to form a silicided polysilicon material 2410, as illustrated in FIG. 24. The resulting semiconductor device is a double gate MOSFET with asymmetrical polysilicon gates.

Figure 25:
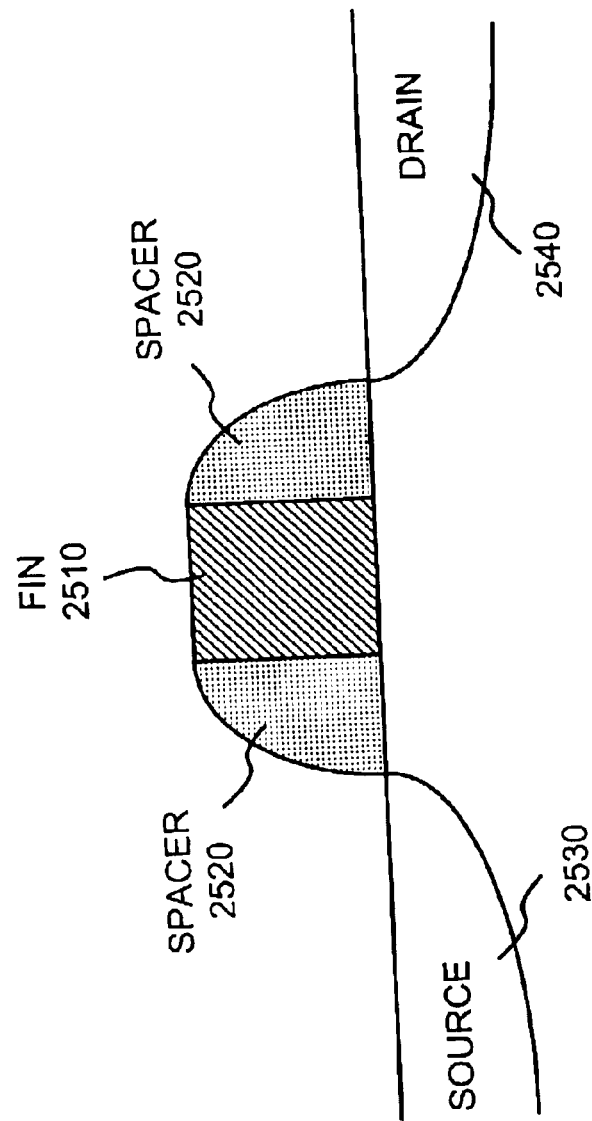
FIGS. 25–28 illustrate an exemplary process for forming source/drain extensions and halo implanting with the use of disposable spacers.

There is also a need in the art to improve the formation of source/drain extensions and halo implanting with the use of disposable spacers. FIGS. 25–28 illustrate an exemplary process for forming source/drain extensions and halo implanting with the use of disposable spacers. After gate patterning and source/drain formation, an exemplary semiconductor device 2500 may include a fin 2510, spacers 2520, source region 2530, and drain region 2540, as illustrated in FIG. 25.

Figure 26:
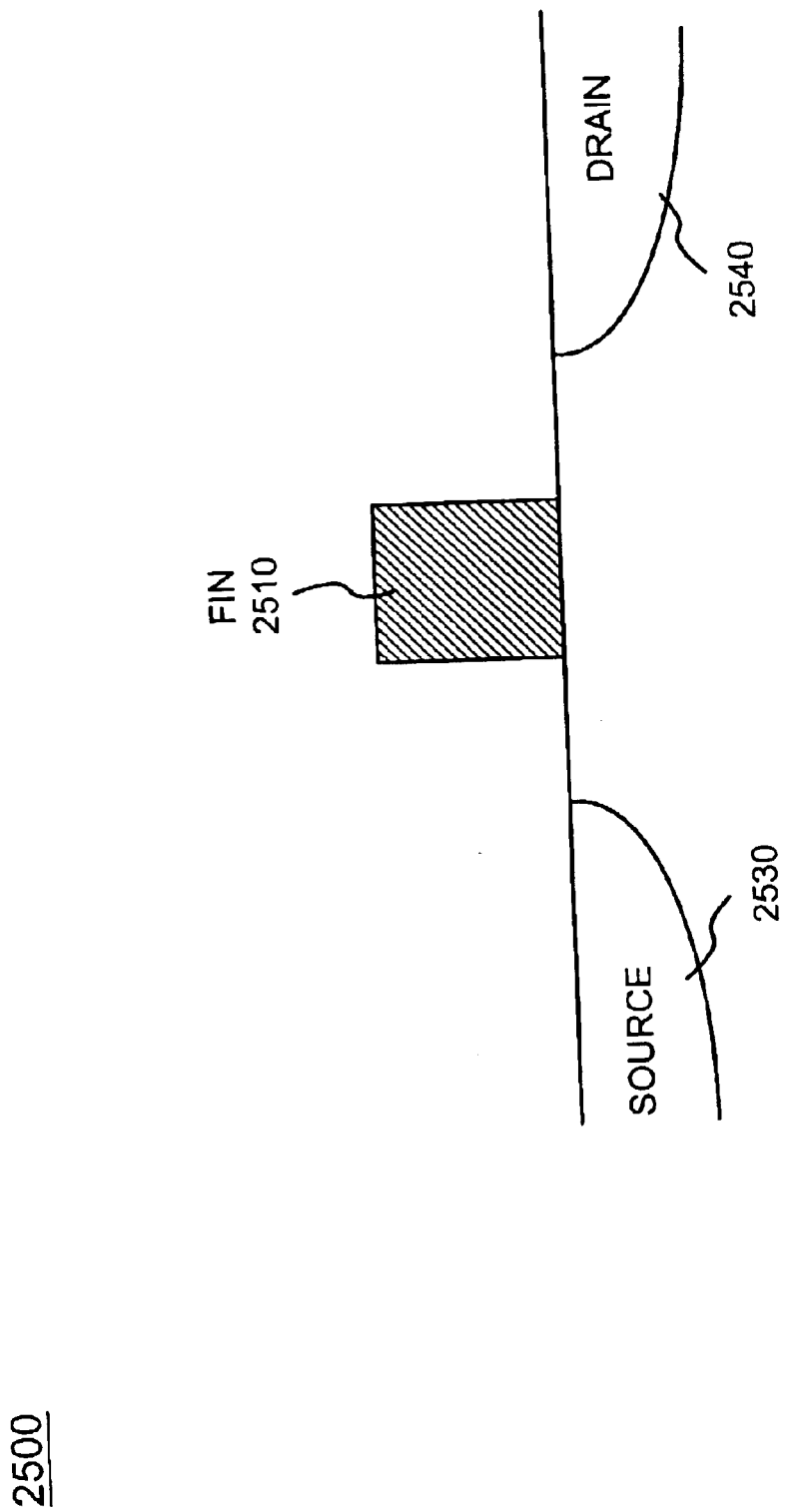
Figure 27:
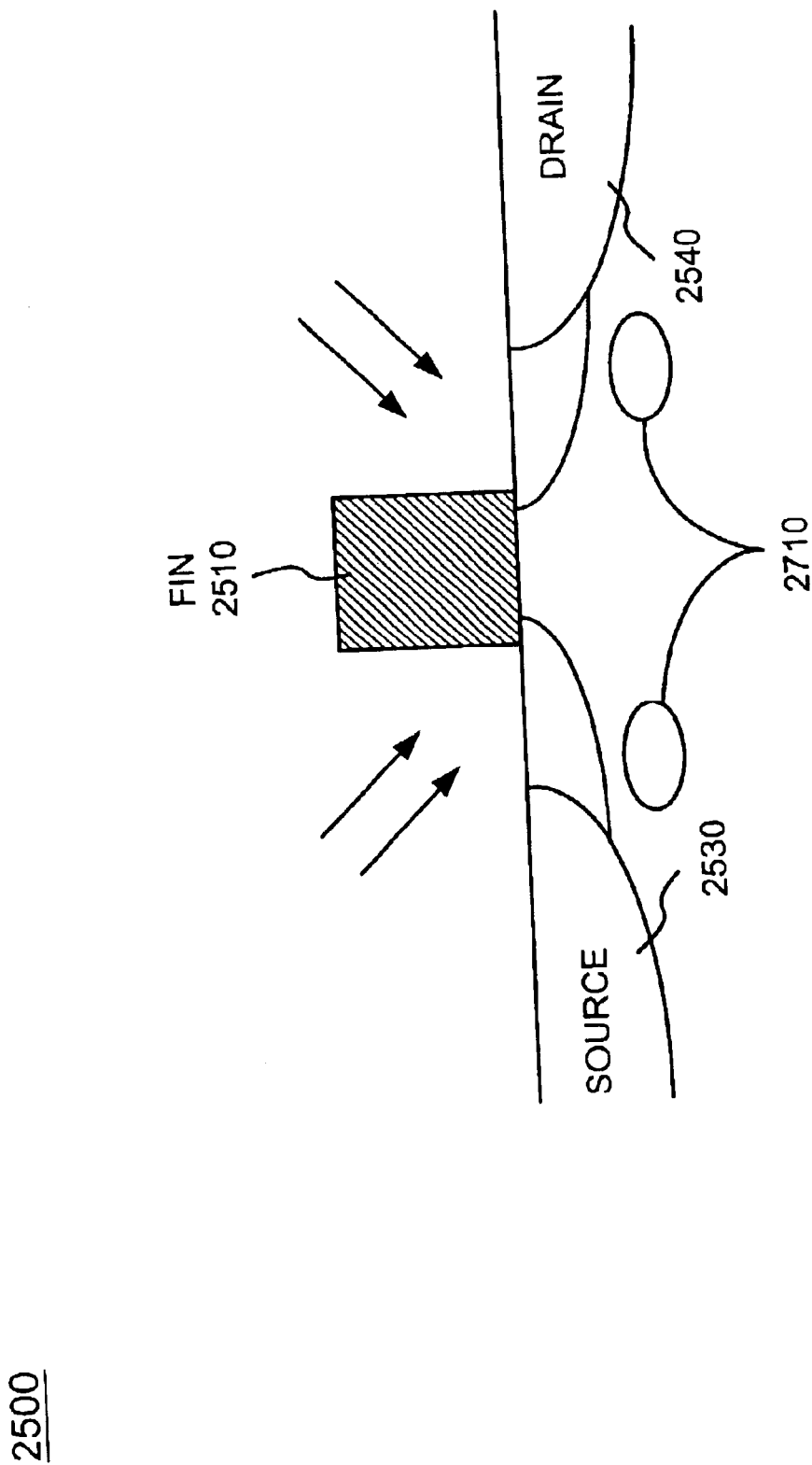
Figure 28:
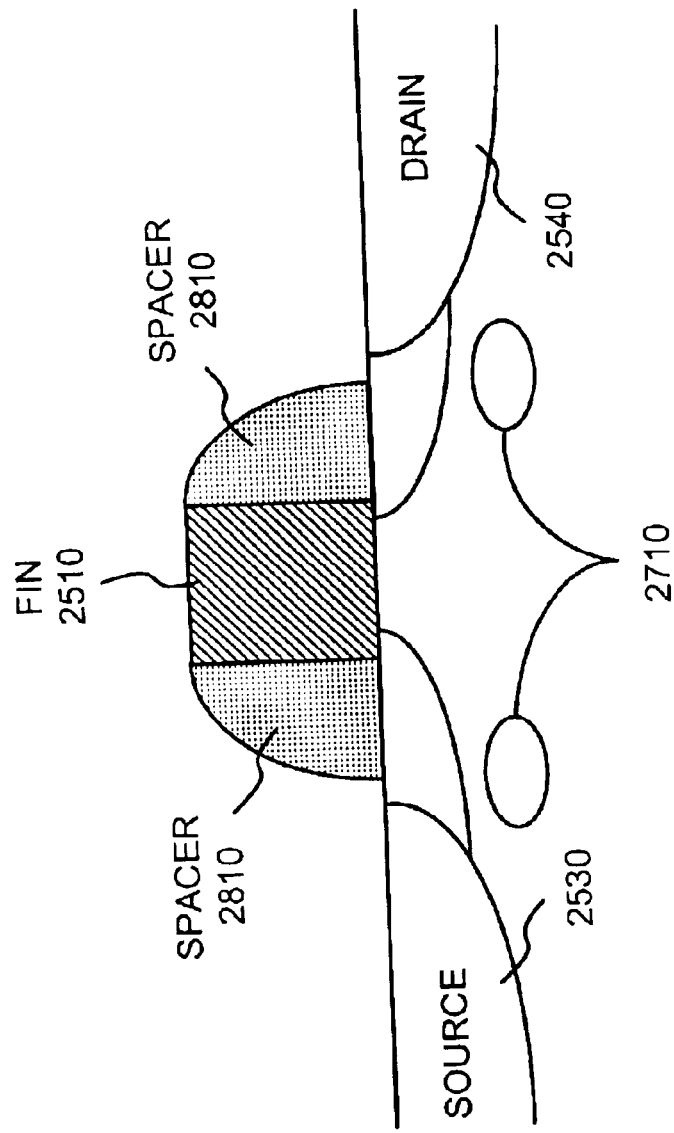

Spacers 2520 may then be removed using conventional techniques, as illustrated in FIG. 26. A halo implantation and source/drain extension implantation may be performed to form halo implants and extend source region 2530 and drain region 2540, as illustrated in FIG. 27. For example, a tilt angle implant, as indicated by the arrows in FIG. 27, may be performed to form halos 2710. A source/drain implantation may then be performed to extend source/drain regions 2530/2540, as illustrated in FIG. 27. The removal of spacers 2520 may facilitate the performance of the source/drain extension and the halo implanting. Spacers 2810 may then be formed on side surfaces of fin 2510, as illustrated in FIG. 28. Conventional techniques may be used to form spacers 2810.

Conclusion

Implementations consistent with the principles of the invention provide asymmetric double and all-around gate FinFET devices and methods of manufacturing these devices. The asymmetric gates may be biased separately. In addition, logic circuits may be formed with the asymmetrical gate devices using less transistors than conventional circuits.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention.

For example, in the above descriptions, numerous specific details are set forth, such as specific materials, structures, chemicals, processes, etc., in order to provide a thorough understanding of implementations consistent with the present invention. These implementations and other implementations can be practiced, however, without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While series of acts have been described with regard to FIGS. 1 and 10, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, used herein, the article "a" is intended to include one or more items. Where only one item is intended, the term "one" or similar language is used. The scope of the invention is defined by the claims and their equivalents.

What is claimed is:

1. A metal-oxide semiconductor field-effect transistor (MOSFET), comprising:

a first fin formed on a substrate;

a second fin formed on the substrate;

a first gate formed adjacent first sides of the first and second fins, the first gate being doped with a first type of impurity; and a second gate formed between second sides of the first and second fins, the second gate being doped with a second type of impurity.

2. The MOSFET of claim 1 wherein each of the first and second fins has a width of approximately 50 Å to 250 Å.

3. The MOSFET of claim 1, wherein a space between the first and second fins ranges from approximately 700 Å to 1500 Å.

4. The MOSFET of claim 3, wherein the first type of impurity includes an n-type impurity and the second type of impurity includes a p-type impurity.

5. A metal-oxide semiconductor field-effect transistor (MOSFET), comprising:

a plurality of fins;

a first gate structure doped with a first type of impurity and formed adjacent a first side of one of the fins;

a second gate structure doped with the first type of impurity and formed adjacent a first side of another one of the fins;

a third gate structure doped with a second type of impurity and formed between two of the fins; and a fourth gate structure formed at least partially beneath one or more of the fins.

6. The MOSFET of claim 5, wherein each of the fins has a width ranging from approximately 50 Å to 250 Å.

7. The MOSFET of claim 5, wherein a space between the fins ranges from approximately 700 Å to 1500 Å.

8. The MOSFET of claim 5, wherein the first type of impurity includes an n-type impurity and the second type of impurity includes a p-type impurity.

\* \* \* \* \*